United States Patent [19]

George

[11] 3,958,180

[45] May 18, 1976

[54] VARACTOR TUNER FREQUENCY CONTROLLER

[75] Inventor: John Barrett George, Indianapolis, Ind.

[73] Assignee: RCA Corporation, New York, N.Y.

[22] Filed: June 3, 1974

[21] Appl. No.: 476,082

[52] U.S. Cl. .................................. 325/422; 325/468

[51] Int. Cl.² ............................................ H04B 1/34

[58] Field of Search ............................ 325/416–420, 325/422, 423, 346, 452, 453, 457, 464, 468, 470; 334/15, 16; 178/DIG. 15; 329/139, 178; 331/1 A, 2, 8, 16, 17, 179

[56] References Cited

UNITED STATES PATENTS

| | | | |
|---|---|---|---|
| 3,259,851 | 7/1966 | Brauer | 331/1 A |
| 3,818,353 | 6/1974 | Sakamoto | 325/422 |
| 3,846,707 | 11/1974 | Sakamoto | 325/453 |
| 3,857,107 | 12/1974 | Lieberman et al. | 331/1 A |

*Primary Examiner*—George H. Libman
*Attorney, Agent, or Firm*—Eugene M. Whitacre

[57] ABSTRACT

A varactor tuner frequency controller wherein a tuning voltage is developed for optimumly tuning a VHF tuner or a UHF tuner to any one of a plurality of channels. A capacitor utilized to store charge for developing the tuning voltage is discharged by means of a pulse developed by a monostable circuit which is gated by a bandswitch reset pulse. Charging of the capacitor is provided for by a positive current source which supplies a substantially constant current to the capacitor in the absence of a hold signal, the hold signal only being present when a selected channel has been reached. In the presence of a hold signal, the current supplied by the positive current source is modified in accordance with an automatic fine tuning signal, and a negative current source supplies a substantially constant current to the capacitor approximately equal to the current supplied by the positive current source in the absence of the hold signal to effect a stopping of the sweep. When irregular spaced channels are being tuned, the negative current source is momentarily disabled in the presence of a hold signal to provide for an incremental sweep of the tuning voltage to place the tuning voltage within a range which will provide for proper automatic fine tuning operation.

9 Claims, 2 Drawing Figures

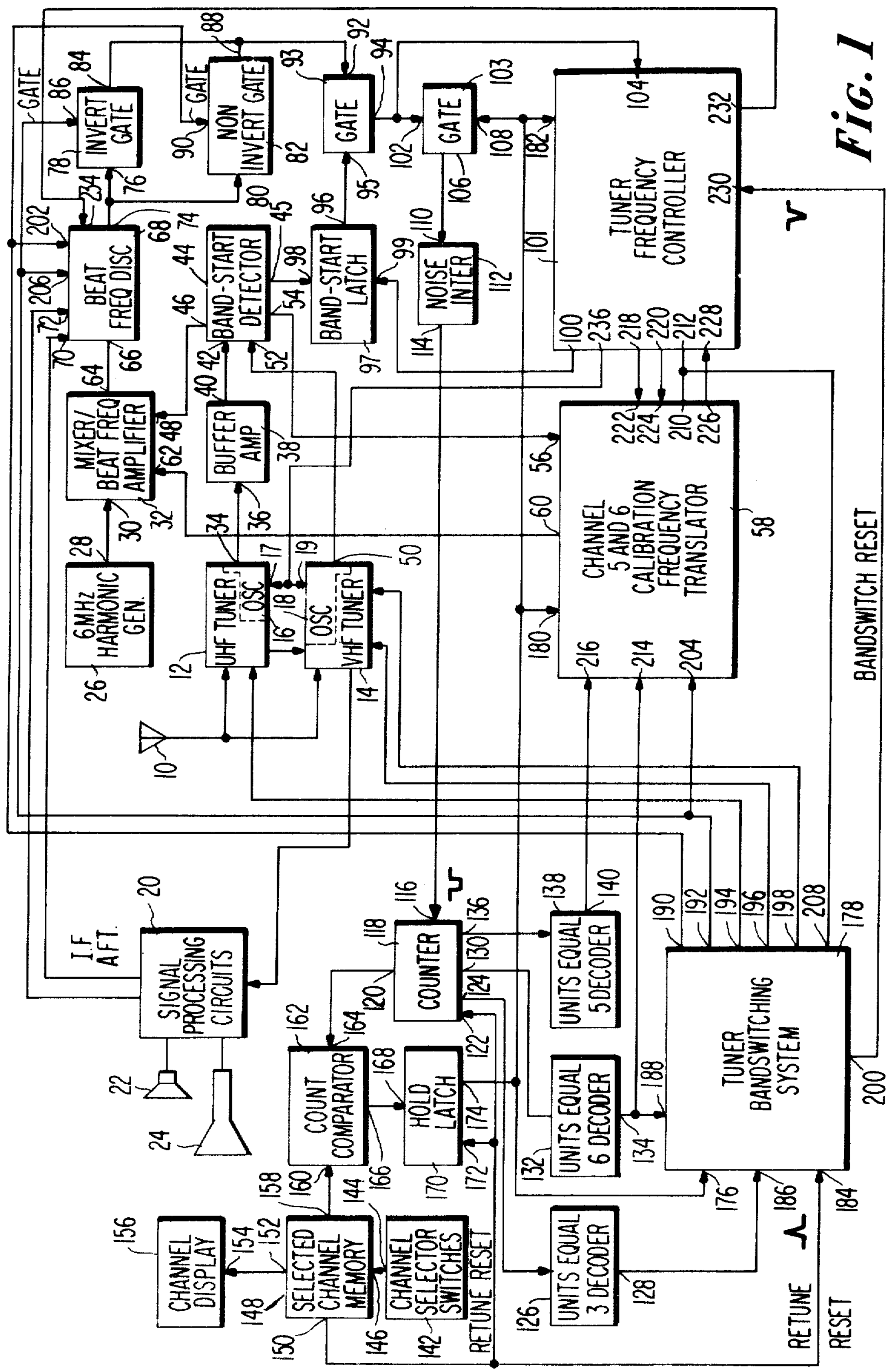
GATE
INVERT GATE
NON INVERT GATE
GATE
GATE
TUNER FREQUENCY CONTROLLER
BEAT FREQ DISC
BAND-START DETECTOR
BAND-START LATCH
NOISE INTER
MIXER/ BEAT FREQ AMPLIFIER
BUFFER AMP
CHANNEL 5 AND 6 CALIBRATION FREQUENCY TRANSLATOR
6MHz HARMONIC GEN.
UHF TUNER
OSC
OSC
VHF TUNER
BANDSWITCH RESET
I.F. AFT.
SIGNAL PROCESSING CIRCUITS
COUNTER
UNITS EQUAL 5 DECODER
COUNT COMPARATOR
HOLD LATCH
UNITS EQUAL 6 DECODER
TUNER BANDSWITCHING SYSTEM
CHANNEL DISPLAY
SELECTED CHANNEL MEMORY
CHANNEL SELECTOR SWITCHES
RETUNE RESET
UNITS EQUAL 3 DECODER
RETUNE
RESET
Fig. 1

VARACTOR TUNER FREQUENCY CONTROLLER

BACKGROUND OF THE INVENTION

This invention relates to a television tuning system and more particularly to a system for supplying a tuning voltage to a voltage tunable tuner.

A tuning system which provides for the selection of any one of a plurality of television channels in a plurality of bands of radio frequencies is disclosed in my copending application Ser. No. 476,081, filed concurrently herewith and entitled, "Random Channel Address Crystal-Lock Tuning System." To access a given channel, data representative of the channel selected is inserted into a memory, and a reset pulse is generated which initiates a sweep of a voltage controllable tuner through a first of the several frequency bands. As the frequency of an oscillator of the tuner is swept, the oscillator signal is compared to a plurality of harmonically related frequency samples. A counter accumulates a count representative of the number of predetermined frequency difference conditions encountered between the oscillator and the harmonically related samples during a period of sweeping. When the data in the memory equals the count in the counter, a hold signal is developed which stops the sweeping of the tuner. If the data in the memory does not equal the count in the counter at the completion of the sweep of the first band of frequencies, a sweep of the second band of frequencies is initiated, and so on, until the data in the memory equals the count in the counter.

In order that the tuning system function as mentioned above, a tuner frequency controller is provided which generates a tuning voltage which can be swept through a range of voltages in the absence of a hold signal and can be reset for resweeping the range of voltages. In addition, the tuner frequency controller provides for an alteration of the tuning voltage in accordance with an automatic fine tuning (AFT) voltage in the presence of a hold signal. This alteration of tuning voltage with AFT signal compensates for various degrees of overshoot of the optimum tuning voltage due to variations in time required to terminate a sweep and for other component and environmental variations after initially arriving at an optimum tuning voltage.

SUMMARY OF THE INVENTION

In accordance with the present invention, a system for controlling said voltage controllable tuner is provided for a television tuning system for selecting any one of a plurality of television channels in at least a first band of radio frequencies by inserting into a memory data representative of the channels and by sweeping an oscillator of a voltage controllable tuner through at least a second band of frequencies. The television channels are identified by comparing a signal from the oscillator with a plurality of harmonically related frequency samples, at least some of which are within the second band of frequencies to develop a plurality of difference frequencies and by accumulating in a counter data representative of the number of times one of the plurality of difference frequencies is within a predetermined frequency range during a period of sweeping of the oscillator. The system for controlling the voltage controllable tuner includes an automatic frequency control means which provides an automatic fine tuning correction signal in response to variations of the oscillator frequency from the oscillator frequency required to receive the one channel. A count comparison means is coupled to the counter and the memory for providing a hold signal when data in the counter and the memory are equal. A first current means is coupled to the count comparison means and the frequency control means for producing a first current having a substantially constant magnitude in the absence of the hold signal and a variable magnitude responsive to the automatic fine tuning signal in the presence of the hold signal. A second current means is coupled to the count comparison means for producing a second current having a substantially constant magnitude in the presence of the hold signal. A charge storage means is coupled to the first and second current means for accumulating a charge proportional to the difference in magnitude and duration of the difference in magnitude between the first and second currents. Means couples the charge storage means to the voltage controllable tuner for controlling the tuning of the tuner in accordance with the charge on the charge storage means.

BRIEF DESCRIPTION OF THE DRAWINGS

The invention will be more readily apparent from a consideration of the following description when taken in connection with the accompanying drawings, in which:

FIG. 1 illustrates in block form a television receiver including a tuning system incorporating the present invention.

DETAILED DESCRIPTION OF THE DRAWINGS

Figure 2:
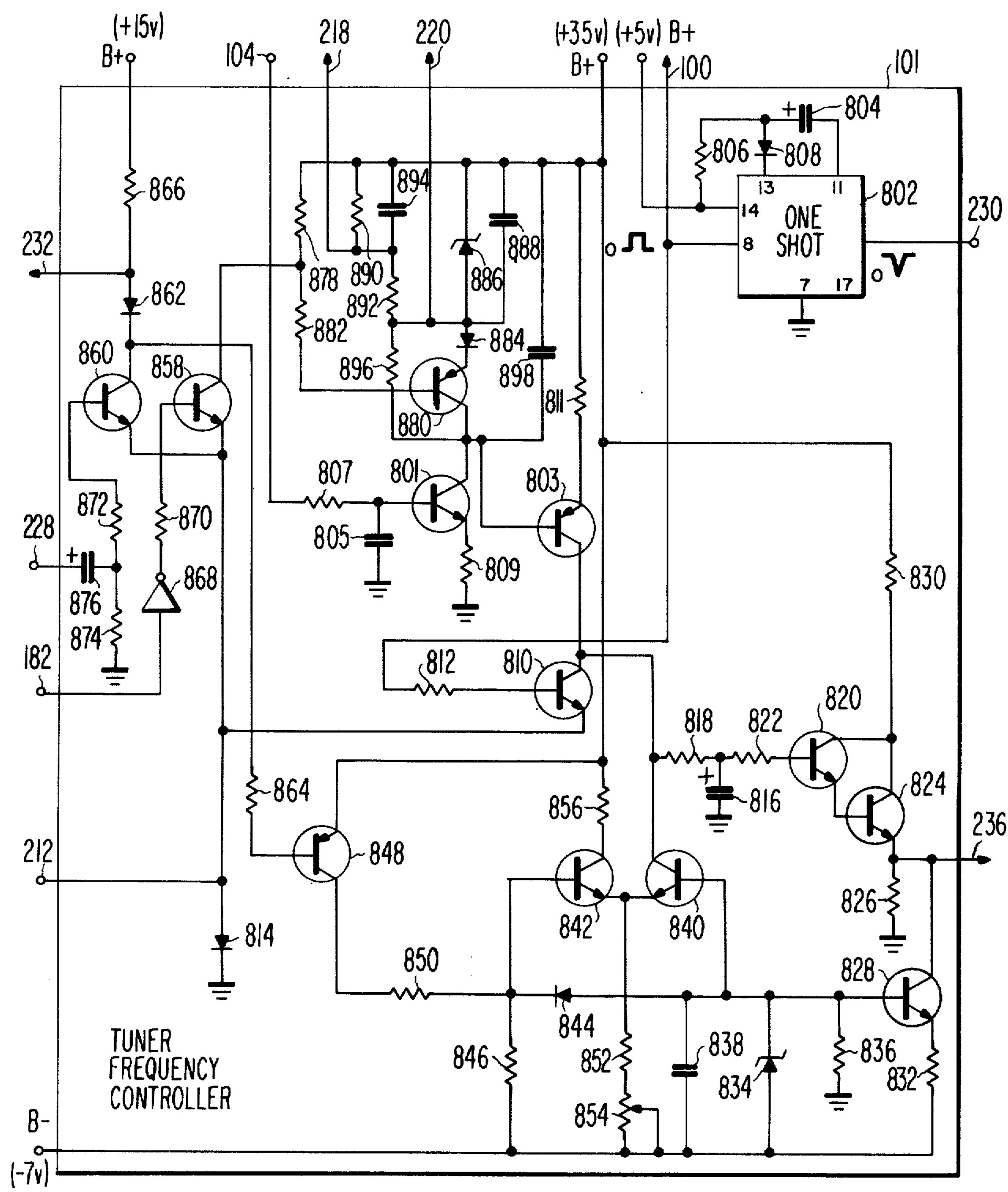
FIG. 2 illustrates in schematic form a tuner frequency controller suitable for use in the system shown in FIG. 1.

In FIG. 1, a television receiver system is shown in block form. In the system of FIG. 1, details of which are set forth in my above-referenced copending application, channel numbers are entered into the tuning system of the television receiver by means of channel selector switches 142, which may, for example, be of the type employed in small electronic calculators. As each digit of the channel number is entered, the data is transferred to a selected channel memory 148. The channel number data which is held in memory is coupled to a channel display 156. Upon the completion of a selection of the second digit of a channel number (e.g., 06 for channel 6), a reset pulse is generated by the selected channel memory 148 and is coupled via a terminal 150 to a terminal 122 of a counter 118, a terminal 172 of a hold latch 170, and to a terminal 184 of a tuner bandswitching system 178. The reset pulse applied to counter 118 provides a reset of the counter 118 to an initial condition (e.g., to a 00 count state). The reset pulse applied to tuner bandswitching system 178 provides for a reset of the tuner bandswitching system 178 to the low VHF band tuning condition and produces a bandswitch reset pulse at a terminal 200 which is coupled to a terminal 230 of a tuner frequency controller 101. The bandswitch reset pulse applied to the tuner frequency controller 101 resets the voltage at a terminal 236 to an initial condition (e.g., zero volts) and produces a reset pulse at a terminal 100 of the tuner frequency controller 101. The reset pulse at terminal 100 is coupled to a terminal 99 of a bandstart latch 97, which produces an initial (e.g., 0 volts) condition at a terminal 96. The voltage at terminal 96 is coupled to the terminal 95 of a gate 93 to disable the gate 93 and thereby prevent signal flow between a terminal 92 and a terminal 94 of the gate 93.

The terminal 174 of hold latch 170 is coupled to a terminal 176 of tuner bandswitching system 178, to a terminal 180 of a channel 5 and 6 calibration frequency translator 58, to a terminal 108 of a gate 103, and a terminal 182 of the tuner frequency controller 101. With zero volts supplied by hold latch 170 to the terminal 108 of the gate 103, the circuit is arranged so that signal can flow between a terminal 102 and a terminal 106. Under these conditions, the tuner frequency controller 101 commences producing a ramp voltage, i.e., the voltage at the terminal 236 becomes more positive as a function of time. This ramp voltage output is coupled to a terminal 17 of an oscillator 16 of a UHF tuner 12 and to a terminal 19 of an oscillator 18 of a VHF tuner 14. The particular tuner which responds is selected by bandswitching system 178. As the voltage on terminal 236 becomes more positive, the frequency of the oscillator 18 increases (oscillator 16 being operational only when sweeping the UHF band). A sample of the oscillator signal existing at a terminal 50 of the oscillator 18 is coupled to a terminal 52 of a bandstart detector 44.

As the frequency of the oscillator 18 continues to increase with increasing voltage at the terminal 236 of the tuner frequency controller 101, the oscillator signal reaches a predetermined frequency (for example, 93 MHz, which is 8 MHz below the oscillator frequency for U.S. channel 2) and a terminal 45 of the bandstart detector 44 becomes more positive. This positive voltage change at the terminal 45 is coupled to a terminal 98 of the bandstart latch 97 to set the bandstart latch and creates a positive voltage on the terminals 96 and 95. Gate 93 is thereby enabled and provides for signal flow between the terminals 92 and 94. It should be noted that since there is no channel 1 in the U.S., the bandstart detector frequency is separated sufficiently from channel 2 industry standard frequency so that pulses are supplied to the counter which correspond with channels being tuned.

The oscillator signal at terminal 52 of the bandstart detector 44 is also coupled to a terminal 54 of the bandstart detector 44, which is coupled to a terminal 56 of the channel 5 and 6 calibration frequency translator 58. At this point, counter 118 has not yet received pulses at a terminal 116 which would advance the count from the 00 count. In that case, the oscillator signal at terminal 56 will be directly coupled without change to a terminal 60 of the channel 5 and 6 calibration frequency translator 58. The oscillator signal appearing at the terminal 60 is coupled to a terminal 62 of a mixer/beat frequency amplifier 32.

A harmonic generator 26 is provided which generates harmonics at the normal channel spacing, i.e., 6 MHz. These harmonics are coupled to a terminal 30 of the mixer/beat frequency amplifier 32. Signals existing at the terminal 30 and the terminal 62 of the mixer/beat frequency amplifier 32 are mixed, the resultant is filtered and amplified, and the beat or difference frequency appears at a terminal 64. The terminal 64 is coupled to a terminal 66 of the beat frequency discriminator 68 where the beat frequency is compared to a predetermined frequency range (e.g., 1 MHz ± 500 KHz). If the beat frequency is greater than the limit of the predetermined range of frequencies, the discriminator produces a first output signal at a terminal 74 (e.g., 0 volts). If the beat frequency is less than the limit of the predetermined range of frequencies, the discriminator produces a second output signal (e.g., a positive voltage) at terminal 74. The change in voltage at terminal 74 therefore creates a pulse as the oscillator 18 is swept through a range of frequencies greater than the spacing between channels.

Pulses appearing at the terminal 74 are coupled to terminal 92 of the gate 93 either by invert gate 78 (during VHF reception) or non-invert gate 82 (during UHF reception). Signals existing at terminal 92 are coupled via the gate 93, the gate 103 and a noise integrator 112 to terminal 116 of the counter 118. Appropriate counting of the pulses generated at the terminal 74 of the beat frequency discriminator 68 provides the necessary information to determine to which channel the tuner 14 is tuned. When the data in the counter 118 equals the data in the selected channel memory 148, the count comparator 162 produces a voltage transition (e.g., positive voltage) at a terminal 166 of the count comparator 162. The voltage on the terminal 166 sets the hold latch 170 and creates a corresponding (e.g., positive) voltage on the terminal 174 of the hold latch 170. The tuner frequency controller 101 then stops sweeping the voltage at the terminal 236 and the gate 103 inhibits flow of signal between terminal 102 and the terminal 106.

When channel 5 or channel 6 is selected by the channel selector switches 142, and the counter 118 has reached a count of 05 or 06, respectively (VHF oscillator 18 at 119 to 125 MHz, respectively), the channel 5 and 6 calibration frequency translator 58 mixes the signal at the terminal 56 with a signal generated by a crystal-controlled oscillator within the calibration frequency translator 58. Also, a voltage (i.e., positive) is applied to terminal 228 of the tuner frequency controller 101 resulting in a +4 MHz frequency shift in the VHF oscillator 18. The crystal-controlled oscillator is arranged to operate at a frequency which will place the shifted difference frequency approximately 1 MHz below a harmonic of 6 MHz. Any one of a plurality of frequencies (6N ± 4) MHz may be employed as a crystal controlled oscillator frequency (e.g., 52 MHz). The resultant shifted frequency is coupled to terminal 60. This non-uniform treatment of the oscillator signal at terminal 56 is made necessary by the fact that the oscillator frequencies required for the reception of channels 5 and 6 are not related to harmonics of the 6 MHz harmonic generator in the same manner as other VHF channels. That is, the oscillator signals required to tune channels 2, 3 and 4 are 1 MHz lower than the nearest harmonic of 6 MHz, while the oscillator signals required to tune channels 5 and 6 are 3 MHz from each of two harmonics of 6 MHz.

When high VHF band channels (7–13) are selected by the channel selector switches 142, the tuner bandswitching system is reset by the retune reset pulse applied to the terminal 184, and a bandswitch reset pulse is developed at a terminal 200. Upon applying the retune reset pulse to the tuner bandswiching system, voltages are supplied to terminals 192 and 198 for operation of the VHF tuner in the low VHF band. When the counter reaches a count of 06, a pulse is supplied to the tuner bandswitching system via a terminal 188, switching the voltage from terminal 198 to terminal 196 for operation of the VHF tuner in the high VHF band, and a bandswitch reset pulse is supplied to terminal 200 as a result of the change.

When UHF band channels (14–83) are selected by the channel selector switches 142, the tuner bandswitching system is reset in the same manner as when high VHF band channels are selected. When the counter reaches a count of 06, voltage is switched from terminal 198 to terminal 196 as described above. When the counter reaches a count of 13, voltage is switched from terminal 192 to terminal 194 for operation of the UHF tuner rather than the VHF tuner, and a bandswitch reset pulse is supplied to terminal 200 as a result of the change.

In FIG. 2, the tuner frequency controller 101 provides a voltage at terminal 236 which is suitable for sweeping each of the tuners 12 and 14 through their tuning ranges and which is controlled in a manner to hold such tuners at appropriate frequencies corresponding to television channel frequencies. Specifically, the voltage at terminal 236 may be reset to approximately 0 volts by means of a negative bandswitch reset pulse on terminal 230, swept through a voltage range of approximately zero to 30 volts when zero volts exist at terminal 182, held at a desirable voltage while providing for minor alterations of voltage level by means of a voltge applied to terminal 104 when the voltage at terminal 182 is positive, and changed a fixed amount when the voltage on terminal 228 goes positive.

In the tuner frequency controller 101, the voltage required to properly control tuners 12 and 14 (FIG. 1) is developed across a capacitor 816 and coupled to terminal 236 by means of an impedance transforming circuit comprising transistors 820, 824, 828 and associated components. A positive current charging source transistor 803 and a negative current charging source transistor 840 are coupled to capacitor 816 to provide for control of the charge on the capacitor 816 in accordance with the difference between the current produced by transistors 803 and 840. A sweep control transistor 858 is coupled to transistor 803 via a transistor 880, and an incremental sweep transistor 860 is coupled to transistor 840 via transistors 848 and 842 to provide for alteration of the voltage on capacitor 816 when either transistor 858 or transistor 860 is saturated. A capacitor 876 and resistors 872 and 874, coupled between terminal 228 and the base of transistor 860, provide for saturation of transistor 860 for an incremental period of time after a positive voltage is applied to terminal 228. The terminal 182 is coupled via an inverting amplifier 868 to the base of transistor 858 thereby providing for saturation of transistor 858 in response to zero voltage at terminal 182.

A one shot 802 is coupled to capacitor 816 via a discharge transistor 810 to accomplish a discharge of capacitor 816 in response to a negative pulse at terminal 230. Transistors 801 and 880 are coupled to transistor 803 to provide for alteration of the voltage on capacitor 816 in response to a variation in an automatic fine tuning correction voltage coupled to terminal 104.

In operation, the tuner frequency controller 101 functions to reset, sweep, hold or impulse change the voltage at terminal 236 to provide for proper control of the UHF tuner 12 or the VHF tuner 14 (FIG. 1).

When a bandswitch reset pulse (e.g., a negative pulse having a four volt reference level) occurs at terminal 230 as a result of the completion of an entry of selected channel data into memory 148 (FIG. 1), or as a result of reaching the end of one band of frequencies, a pulse, for example of positive polarity, is produced at pin 8 of oneshot (monostable) integrated circuit 802. The latter pulse is provided to reset bandstart latch 97 (FIG. 1) via terminal 100 and to switch the discharge transistor 810 to saturation condition to substantially discharge capacitor 816 to an initial condition. A resulting collector voltage of approximately 1 volt (voltage drop across diode 814 plus the collector to emitter saturation potential of transistor 810) provides a path for discharge of capacitor 816 to such voltage. The capacitor 816, which preferably is a tantalum capacitor, retains the one volt charge. After the period of the pulse at terminal 8 of the one-shot integrated circuit 802 (e.g., approximately 10 microseconds), the transistor 810 cuts off due to the presence of an 0.7 volt bias on its emitter and approximately zero volts at pin 8 of one-shot integrated circuit 802. The 1 volt condition across capacitor 816 is sufficient to bias transistors 820 and 824 to a conduction threshold and, at the same time, to produce a substantially zero volt (initial) condition at terminal 236. As stated above, terminal 236 is coupled to the inputs of tuners 12 and 14. The zero volt condition corresponds to an initial frequency condition of the tuners.

SWEEP

In the sweep mode, the transistor 803 is driven to a substantially constant current condition to provide the desired voltage ramp across capacitor 816. This result is produced as follows. The voltage on terminal 182 is approximately zero volts as a result of a lack of a hold signal from hold latch 170 (FIG. 1), i.e., no match between input channel and tuned channel. The output of the inverting amplifier 868 provides a positive voltge which produces saturation of transistor 858 and a resultant collector voltage of approximately 1 volt (the voltage drop across diode 814 plus the saturation potential of the transistor 858). Transistor 848 also is saturated by virtue of its emitter being coupled to B+ (+35 volts) and its base being coupled to the collector of transistor 858 via resistor 864. With the transistor 848 in saturation, the voltge at the junction of resistors 850 and 846 provides for saturation of the transistor 842 and provides an emitter voltage to the transistor 840 which is greater than the base voltage of transistor 840, therefore placing the transistor 840 in cutoff.

In addition, the saturation of the transistor 858 results in saturation of transistor 880 and stabilization of the voltage between the base of transistor 803 and B+ (+35 volts) by means of zener diode 886, diode 884 and transistor 880, therefore providing for a substantially constant collector current in transistor 803. Since transistor 810 and transistor 840 are in cutoff, the collector current of transistor 803 flows through resistor 818 to capacitor 816. The resulant ramp of voltage that is developed across the capacitor 816 is coupled via transistors 820 and 824 to output terminal 236 to cause the frequency of the appropriate tuner oscillator to vary over an appropriate band of frequencies dependent upon the condition of the tuner bandswitching system 178.

HOLD

Once the capacitor 816 has reached a level of charge which provides for tuning of either UHF tuner 12 or VHF tuner 14 (FIG. 1) to a frequency where a hold signal is produced by count comparator 162, the voltage at terminal 182 changes (e.g., goes positive) which results in a predetermined (zero) voltage at the output terminal of inverting amplifier 868 and a cutoff of the transistor 858. With transistor 858 cut off, transistor 880 is cut off. The collector potential of transistor 801 then is determined by the voltage on terminal 104 which is the AFT correction voltage supplied in the television receiver. As the automatic fine tuning correction voltage at terminal 104 varies, the collector voltage of transistor 801 also varies, thereby changing the voltage applied to the base of transistor 803. As the voltage on the base of transistor 803 varies, its collector current is altered, thereby changing the positive charging current supplied to the capacitor 816.

Also, with the transistor 858 cut off, transistor 848 is cut off; transistor 842 is placed in cutoff and current flows in the collector of transistor 804. A portion of the collector current of transistor 803 is diverted from capacitor 816, stopping the ramp of the voltage at terminal 236 and holding it constant. The differential current between the collector current of transistor 803 and the collector current of transistor 840 is maintained approximately equal to the leakage current in the capacitor 816 and associated components by the variations in the current of transistor 803 effected by the automatic fine tuning correction voltage at terminal 104.

IMPULSE CHANGE

Where one of the irregularly spaced channels (e.g., channels 5 and 6) are selected, an irregular voltage impulse is supplied to capacitor 816. That is, when the terminal 226 of channel 5 and 6 calibrations frequency translator 58 (FIG. 1) goes positive due to a selection and subsequent tuning of channel 5 or 6, a positive voltage is applied to terminal 228 from frequency translator 58. Transistor 8860 is saturated for a period determined by the time constant of resistor 872, resistor 874 and capacitor 876. During the period of saturation of the transistor 860, transistor 880 is saturated providing for a fixed collector current in the transistor 803, saturation of transistor 848 and transistor 842, and cutting off the negative current source transistor 840. The capacitor 816 is therefore charged for a period during which the transistor 860 is saturated. The change of voltage on capacitor 816 results in an increase of the oscillator signal frequency of VHF tuner 14, for example, by 4 MHz. Saturation of the transistor 860 also provides for a current flow through the resistor 866 and the diode 862, resulting in a voltage of approximately 1.7 volts at the terminal 232. Terminal 232 is coupled to beat frequency discriminator 68 (FIG. 1) and provides for a defeating of the IF automatic fine tuning effect on the beat frequency discriminator during any change of the charge on the capacitor 816.

The voltages on terminal 218 and terminal 220 provide stable voltages with respect to B+ (+35 volts) for switching transistors in the channel 5 and 6 calibration frequency translator 58.

What is claimed is:

1. In a television tuning system for selecting any one of a plurality of television channels in at least a first band of radio frequencies by inserting into a memory data representative of said channels, and by sweeping an oscillator of a voltage controllable tuner through at least a second band of frequencies; said television channels being identified by comparing a signal from said oscillator with a plurality of harmonically related frequency samples, at least some of which are within said second band of frequencies, to develop a plurality of difference frequencies, and by accumulating in a counter data representative of the number of times one of said plurality of difference frequencies is within a predetermined frequency range during a period of sweeping of said oscillator, a system for controlling said voltage controllable tuner comprising:

means responsive to an automatic fine tuning correction voltage for providing control signals in response to a difference in frequency between said oscillator frequency and an oscillator frequency required to receive said one channel;

count comparison means coupled to said counter and said memory for providing a hold signal when data in said counter and said memory are equal;

a first current means coupled to said count comparison means and said automatic fine tuning correction responsive means for producing a first current having a substantially constant magnitude in the absence of said hold signal and a variable magnitude responsive to said automatic fine tuning voltage in the presence of said hold signal;

a second current means coupled to said count comparison means for producing a second current having a substantially constant magnitude in the presence of said hold signal;

a charge storage means coupled to said first and second current means for accumulating a charge proportional to the difference in magnitude and duration of the difference in magnitude between said first and second currents; and means coupling said charge storage means to said voltage controllable tuner for controlling the tuning of said tuner in accordance with said charge on said charge storage means.

2. The combination as in claim 1 wherein said charge storage means is a capacitor.

3. The combination as in claim 1 wherein said means coupling said charge storage means to said voltage controllable tuner comprises:

an impedance transforming means having a high impedance input terminal and a low impedance output terminal, said high impedance input terminal being coupled to said charge storage means and said low impedance output terminal being coupled to said voltage controllable tuner.

4. The combination as in claim 3 wherein said means coupling said charge storage means to said voltage controllable tuner further comprises:

a third current means coupled to said impedance transforming means for maintaining a substantially constant impedance at said low impedance output terminal at all levels of charge on said charge storage means.

5. The combination as in claim 4 wherein said impedance transforming means is a transformer having a base, an emitter and a collector electrode, being connected in a common collector configuration and having said base electrode coupled to said charge storage means and said eitter electrode coupled to said voltage controllable tuner.

6. The combination as in claim 1 and further comprising reset means coupled to said charge storage means for discharging the accumulated charge upon the completion of the insertion of data representative of one of said channels into said memory, said reset means therefore providing a relatively uniform frequency from which to start a sweep of said oscillator through said second band of frequencies.

7. The combination as in claim 6 wherein said reset means comprises a monostable means coupled to said memory and said charge storage means thus providing a momentary path for discharge of the accumulated charge on said charge storage means upon the completion of the insertion of data representative of one of said channels into said memory.

8. The combination as in claim 1 and further comprising an incremental frequency shifting means coupled to said counter and to said count comparison means for defeating said hold signal for a predetermined period of time when data representative of at least a first particular one of said channels is accumulated in said counter after said first particular one of said channels has been selected.

9. In a television tuning system for selecting any one of a plurality of television channels in at least a first band and a second band of radio frequencies by inserting into a memory data representative of one of said channels, and by sweeping an oscillator of a voltage controllable tuner through at least a third band and a fourth band of frequencies; said television channels being identified by comparing a signal from said oscillator with a plurality of harmonically related frequency samples, at least some of which are within said third and said fourth bands of frequencies, to develop a plurality of difference frequencies and by accmulating in a counter data representative of the number of times one of said plurality of difference frequencies is within a predetermined frequency range during a period of sweeping of said oscillator; a system for controlling said voltage controllable tuner comprising:

means responsive to an automatic fine tuning correction voltage for providing control signals in response to a difference in frequency between said oscillator frequency and an oscillator frequency required to receive said one channel;

count comparison means coupled to said counter and said memory for providing a hold signal when data in said counter and said memory are equal;

a first current means coupled to said count comparison means and said automatic fine tuning correction responsive means for producing a first current having a substantially constant magnitude in the absence of said hold signal and a variable magnitude responsive to said automatic fine tuning voltage in the presence of said hold signal;

a second current means coupled to said count comparison means for producing a second current having a substantially constant magnitude in the presence of said hold signal;

a charge storage means coupled to said first and second current means for accumulating a charge proportional to the difference in magnitude and duration of the difference in magnitude between said first and second currents;

means couplig said charge storage means to said voltage controllable tuner for controlling the tuning of said tuner in accordance with said charge on said charge storage means; and reset means coupled to said charge storage means for discharging the accumulated charge upon the completion of the insertion of data representative of one of said channels into said memory and upon the completion of said sweeping of said oscillator through said third band of frequencies.

* * * * *